(12) United States Patent
Jensen et al.

(10) Patent No.: US 8,296,346 B2
(45) Date of Patent: *Oct. 23, 2012

(54) CHANNEL-SELECT DECIMATION FILTER WITH PROGRAMMABLE BANDWIDTH

(75) Inventors: Henrik T. Jensen, Long Beach, CA (US); Brima B. Ibrahim, Aliso Viejo, CA (US)

(73) Assignee: Broadcom Corporation, Irvine, CA (US)

(*) Notice: Subject to any disclaimer, the term of this patent is extended or adjusted under 35 U.S.C. 154(b) by 429 days.

This patent is subject to a terminal disclaimer.

(21) Appl. No.: 12/690,532

(22) Filed: Jan. 20, 2010

(65) Prior Publication Data

US 2010/0120387 A1    May 13, 2010

Related U.S. Application Data

(63) Continuation of application No. 11/189,910, filed on Jul. 26, 2005, now Pat. No. 7,685,217.

(51) Int. Cl.
*G06F 17/17* (2006.01)
*G06F 17/10* (2006.01)

(52) U.S. Cl. ........................ 708/313; 708/316
(58) Field of Classification Search .............. 708/713, 708/716
See application file for complete search history.

(56) References Cited

U.S. PATENT DOCUMENTS

| 5,689,449 | A  | * | 11/1997 | Saramaki et al. | 708/313 |
| 6,279,019 | B1 | * | 8/2001  | Oh et al.       | 708/300 |
| 7,047,263 | B2 | * | 5/2006  | Todsen et al.   | 708/313 |
| 7,406,136 | B2 | * | 7/2008  | Jensen          | 375/316 |
| 7,685,217 | B2 | * | 3/2010  | Jensen et al.   | 708/313 |

* cited by examiner

*Primary Examiner* — Chuong D Ngo
(74) *Attorney, Agent, or Firm* — Garlick & Markison; Holly L. Rudnick

(57) ABSTRACT

A channel-select decimation filter capable of operating in multiple bandwidth modes includes a first low pass filter stage, a variable gain stage, a subtraction module a second low pass filter stage and a down-sampling module. The first low pass filter stage includes a first programmable delay module for filtering input signals to produce first low pass filtered signals. The variable gain stage applies a programmable gain to the input signals to produce gained input signals. The subtraction module subtracts the first low pass filtered signals from the gain input signals to produce first stage signals. The second low pass filter stage includes a second programmable delay module for filtering the first stage signals to produce channel-selected signals. The first programmable delay module, second programmable delay module and programmable gain are programmed to implement one of the multiple bandwidth modes.

20 Claims, 9 Drawing Sheets

CHANNEL-SELECT DECIMATION FILTER WITH PROGRAMMABLE BANDWIDTH

CROSS REFERENCE TO RELATED PATENTS

The present U.S. Utility Patent Application claims priority pursuant to 35 U.S.C. §120, as a continuation, to the following U.S. Utility Patent Application which is hereby incorporated herein by reference in its entirety and made part of the present U.S. Utility Patent Application for all purposes:

U.S. Utility application Ser. No. 11/189,910, now U.S. Pat. No. 7,685,217, entitled "CHANNEL-SELECT DECIMATION FILTER WITH PROGRAMMABLE BANDWIDTH," filed Jul. 26, 2005.

BACKGROUND OF THE INVENTION

1. Technical Field of the Invention

This invention relates generally to radio receivers and more particularly to filtering within radio receivers.

2. Description of Related Art

The drive towards systems-on-chip solutions for wireless radio applications continues to replace traditionally analog signal processing tasks with digital processing to exploit the continued shrinkage in die area and reduction in power consumption of digital CMOS technology. The idea is to relax analog signal processing requirements and relegate more processing to the digital domain where, in addition to the reduced silicon area requirements, the processing is insensitive to process and temperature variations.

Since an increasing amount of the signal processing of the modern radio is relegated to the digital domain, many efforts have gone into developing hardware efficient, low power digital signal processing algorithms that perform the processing necessary in the receiver sections of the radio. Probably the most important task in the digital signal processing of radios is the task of filtering. Filtering is used to remove undesired noise and interfering signals in order to provide high signal-to-noise ratio (SNR) in the processing path.

Sharp digital low pass filters (LPFs) with carefully selected bandwidths are commonly employed in radio receivers to remove interferers and noise. Such digital LPFs are often referred to as "channel-select" filters. These filters must be designed to be very frequency selective while maintaining linear phase response in order not to cause distortion of the received signal. Employing digital filters with non-linear phase response is possible, but undesirable, since this would generally require compensation in later processing stages. Such compensation typically requires a substantial amount of digital processing.

A popular class of filters for channel-select filtering is finite impulse response (FIR) filters because of their inherent linear phase response. As the name implies, an FIR filter, H(z), can be represented in the discrete-time domain with a finite sequence of coefficients as in the following general form of the Z-transform of the impulse response $$H(z) = h_0 + h_1 z^{-1} + \ldots + h_N z^{-N} = \sum_{i=0}^{N} h_i z^{-i}, \quad (1)$$

FIR filters are commonly followed by a down-sampling module that reduces the sampling rate of the digital signal. The combined FIR filter and down-sampler is referred to as a channel-select decimation filter. Decimation filters are often encountered in receivers since the analog-to-digital converters (ADCs) are typically high sampling rate devices. As a result, it is often desired to reduce the sampling rate as part of the filtering process, which reduces power consumption and complexity of the subsequent processing stages.

In addition to performing frequency selective filtering and reducing the sampling rate, decimation filters are typically also used to introduce magnitude equalization in the signal path of the receiver. Magnitude equalization is the task of compensating for the in-band magnitude droop caused by the preceding analog filtering stages. Typically, analog filtering imposes some degree of in-band droop in the signal path in order to provide adequate attenuation of close-in interferers. This in-band droop represents signal distortion, and may lead to degraded receiver performance. Thus, for optimal receiver performance, this magnitude distortion must be compensated for in the digital domain by some equalization mechanism. The result is that the combined magnitude response of the analog and digital filtering as closely as possible resembles that of an ideal "brick-wall" filter.

A disadvantage of decimation filters is that they typically require a large number of multiplications and additions to perform the narrowband frequency selective low pass filtering and magnitude equalization needed in high-performance receivers. Defined as the standard measure of hardware complexity of decimation filters, the number of multiplications and additions needed per clock cycle is directly related to power consumption and required chip die area. Thus, for low power and low cost radios, it is imperative to reduce the hardware complexity of the digital filters as much as possible.

Therefore, hardware efficient decimation filters have recently been introduced that perform channel magnitude equalization, are low-power, and are capable of performing narrowband frequency selective low pass and equalization filtering without the use of a large number of multipliers. These hardware efficient decimation filters typically incorporate multiple low pass filter stages that utilize simple adders to produce channel-selected signals. However, the reduced hardware complexity also necessitates that the design of these decimation filters be specifically tailored to a particular bandwidth. In situations where the signal is too weak to effectively remove undesired noise and interfering signals, it may be desirable to increase the bandwidth to improve the signal power.

Therefore, a need exists for a hardware efficient decimation filter that is capable of performing narrowband frequency selective low pass and equalization filtering with a programmable bandwidth.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
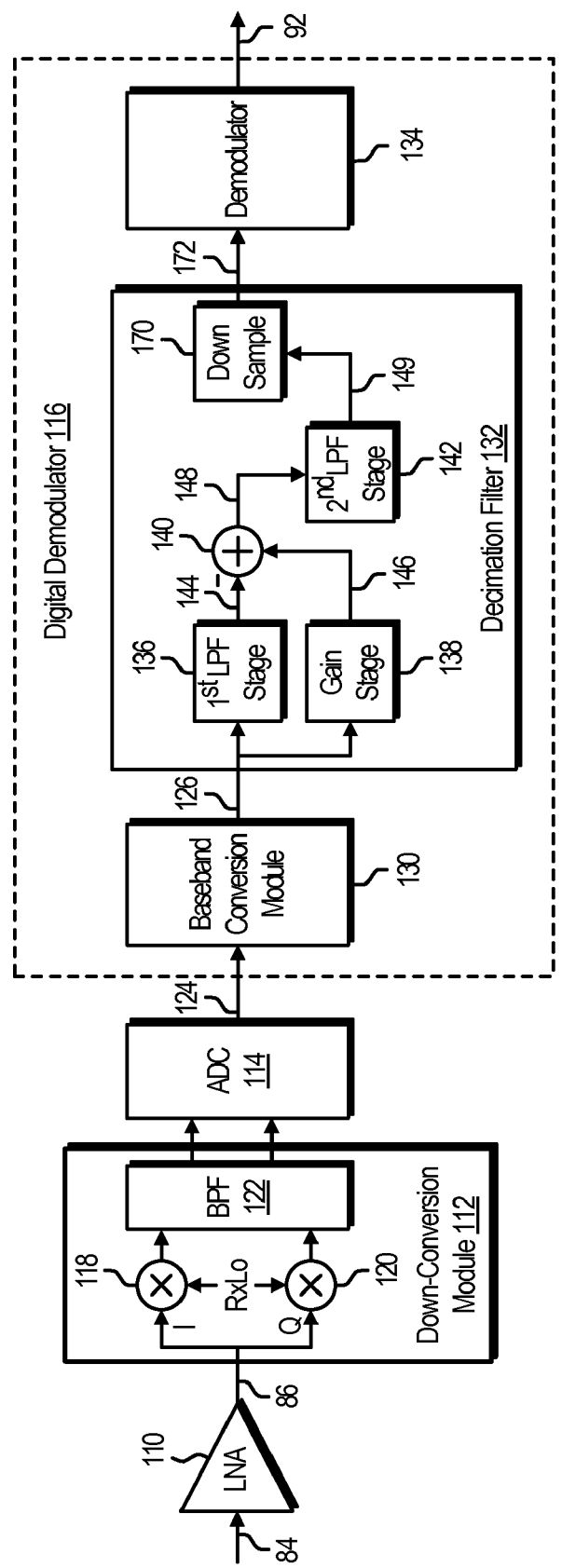
FIG. 1 is a schematic block of a radio receiver in accordance with the present invention.

FIG. 1 is a schematic block diagram of a radio receiver 68 that includes a low noise amplifier 110, a down conversion module 112, an analog to digital converter 114, and a digital demodulator 116. The down conversion module 112 includes mixers 118 and 120 and an analog bandpass filter (BPF) 122.

In operation, the low noise amplifier 110 amplifies the inbound RF signals 84 to produce amplified inbound RF signals 86. The amount of amplification of the low noise amplifier depends on the received signal strength of the inbound RF signals 84 and the dynamic range of the analog to digital converter 114. The mixers 118 and 120 of the down conversion module 112 mix the amplified inbound RF signals 86 with an in-phase (I) and quadrature (Q) components of a receiver local oscillation, respectively, to produce in-phase mixed signals and quadrature mixed signals.

The analog bandpass filter 122 substantially passes the frequency difference component of the in-phase and quadrature mixed signals unattenuated and attenuates the frequency sum component of the in-phase and quadrature mixed signals to produce low intermediate frequency (IF) signals. The analog to digital converter 114 converts the low IF signals from the analog domain to the digital domain to produce digital low IF signals 124.

The digital demodulator 116 converts the digital low IF signals 124 into inbound symbols 92, which may be binary data, PSK data, and/or FSK data. The digital demodulator 116 includes a baseband conversion module 130, a channel-select decimation filter 132 and a demodulator module 134. The channel-select decimation filter 132 includes a first low pass filter stage 136, a gain stage 138, a subtraction module 140, a second low pass filter stage 138 and a down-sampling module 170.

In operation, the baseband conversion module 130 converts the digital low IF signals 124 into digital baseband signals 126. In one embodiment, the baseband conversion module 130 includes an anti-aliasing filter that reduces the sample rate, and a direct digital frequency synthesizer (DDFS) and mixers that de-rotate the signal to baseband. The first low pass filter stage 136 of the channel-select decimation filter 132 filters the digital baseband signals 126 to produce first low pass filter signals 144. The gain module 138 adjusts the gain of the digital baseband signals 126 to produce gained digital baseband (BB) signals 146. The subtraction module 140 subtracts the first LPF signals 144 from the gained digital BB signals 146 to produce first stage signals 148. The second LPF stage 142 filters the first stage signals 148 to produce channel-selected signals 149. The down-sampling module 170 reduces the sampling rate of the channel-select signals 149 to produce down-sampled signals 172. The demodulator 134 converts the down-sampled signals 172 into inbound digital symbols 92.

The channel-select decimation filter 132 shown in FIG. 1 provides a hardware-efficient narrowband frequency selective low pass filter that incorporates magnitude equalization response for applications where very low power consumption and die area requirement is of concern, such as in radio receivers. Further, as will subsequently be described, the channel-select decimation filter 132 may be implemented using primarily adders and registers and include only one or no multipliers. In addition, as will be described in various embodiments as depicted in one or more of FIGS. 2-9, the channel-select decimation filter 132 is programmable to support different bandwidths.

Figure 2:
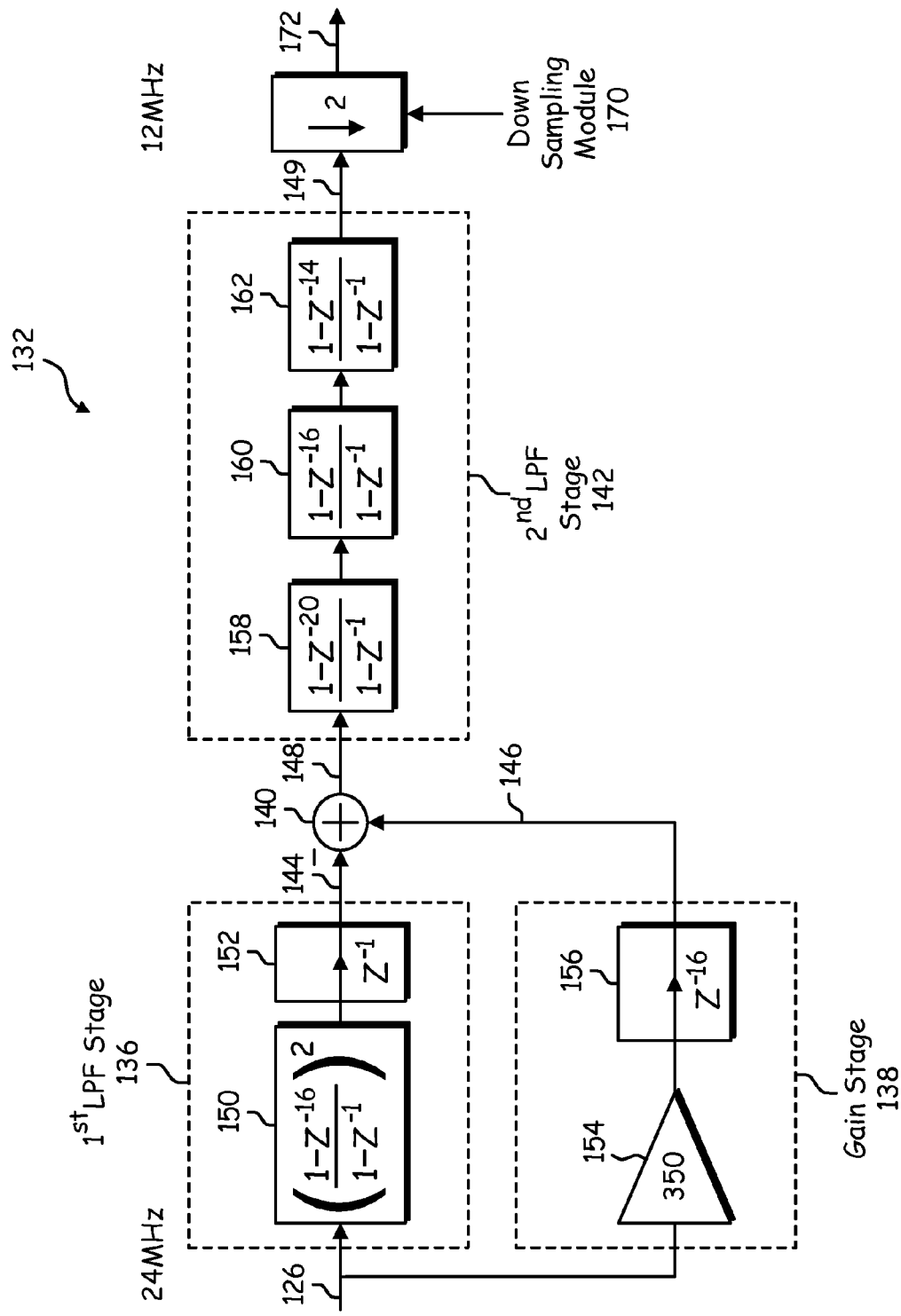
FIG. 2 is a schematic block diagram of an embodiment of a channel-select decimation filter in accordance with the present invention.

FIG. 2 illustrates details of the signal processing blocks of an embodiment of digital channel-select decimation filter 132 that includes the first LPF stage 136, the gain stage 138, the subtraction module 140, the second LPF stage 142 and the down-sampling module 170. As shown, the first LPF stage 136 includes a multiple order "comb" filter 150 and a delay module (register) 152, the second LPF stage 152 includes a linear combination of "comb" filters 150, 160 and 162, and the gain stage 154 includes a gain 154 and a delay module 156. The filter 132 of FIG. 2 is an FIR filter and thus has linear phase response since all sub-blocks 150, 158, 160 and 162 of the filter 132 are comb-filters, i.e., filters of the form $$\frac{1-z^{-N}}{1-z^{-1}}, \qquad (2)$$

which, indeed, are FIR filters since $$\frac{1-z^{-N}}{1-z^{-1}} = \frac{(1-z^{-1})\sum_{i=0}^{N-1} z^{-i}}{(1-z^{-1})} = \sum_{i=0}^{N-1} z^{-i}. \qquad (3)$$

It follows that the filter of FIG. 2 is an FIR filter since it consists of a linear combination of FIR filters.

The down-sampling module 170 reduces the sampling rate of the digital signal. In this example, a 2-fold down-sampler is employed and the sampling rate is reduced from 24 MHz to 12 MHz by simply discarding every second sample of the filter output. For example, suppose x[n]= . . . 3, 5, 1, 7, 8, . . . . The 2-fold down-sampled sequence y[n] is then y[n]= . . . 3, 1, 8, . . . . In general, an N-fold down-sampler operating on a sequence x[n] outputs a sequence y[n] according to: y[n]=x[nN].

Figure 3:
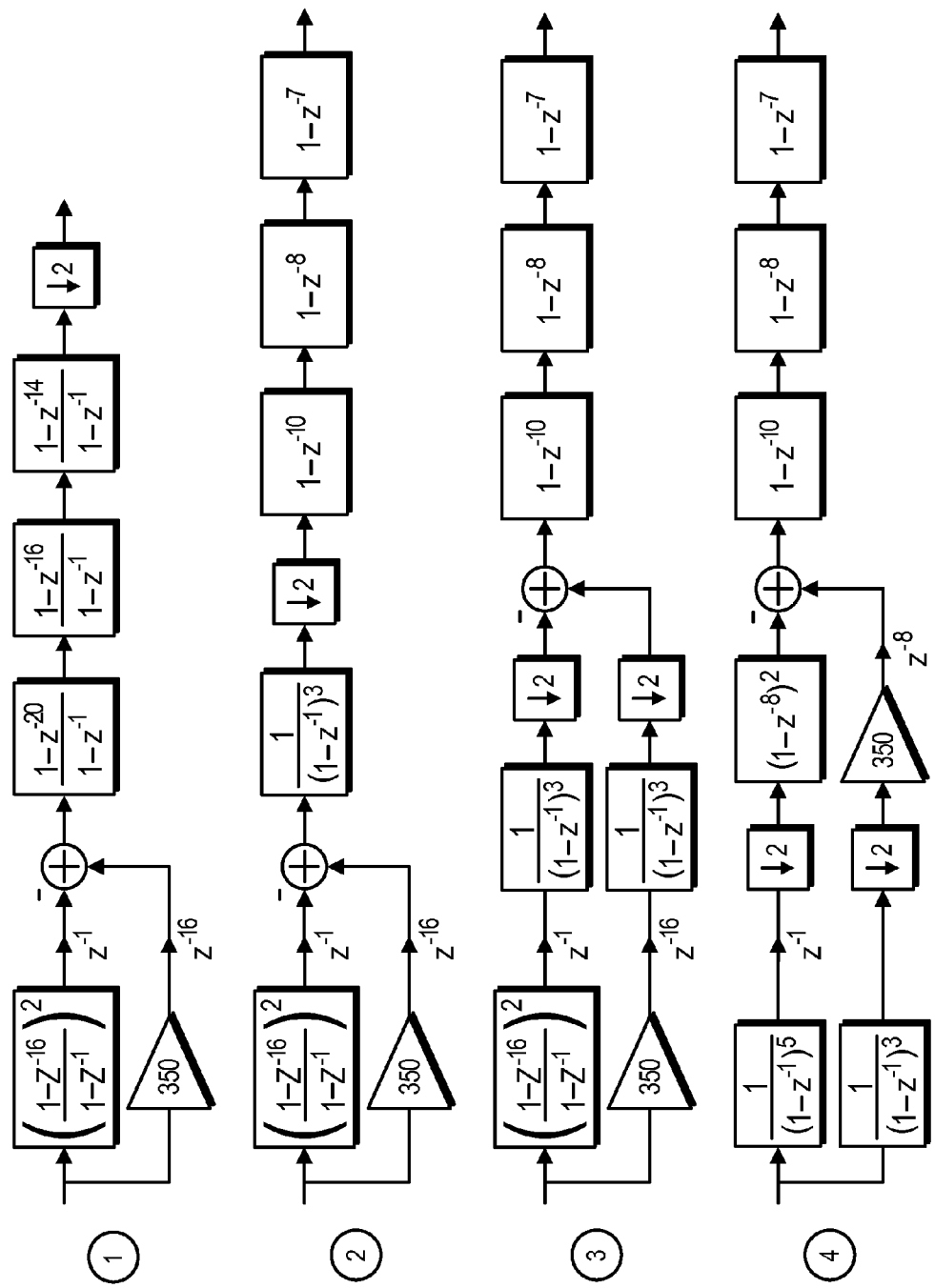
FIG. 3 is a diagram illustration simplification of a channel-select decimation filter in accordance with the present invention.

FIG. 3 illustrates a sequence of steps used to arrive at a complexity reduction of the channel-select decimation filter of FIG. 2. To reduce the complexity, a digital processing identity, such as a Noble identity, is used. In general, the Noble identity states that the signal processing performed by considering a filter G($z^N$) followed by an N-fold down-sampler is equivalent to the signal processing performed by first down-sampling the signal and then applying the filter G(z). The advantage of applying this equivalence is reduced hardware complexity of the filtering due to a reduced number of registers and reduced power consumption due to the filter operating at a lower sampling rate.

Referring now to FIG. 3, from step 1 to step 2, the Noble identity is applied to the three right-most comb filters. Only the numerator is a function of $z^2$, the denominator cannot be simplified using this rule.

From step 2 to step 3, the cascade of the term $$\frac{1}{(1-z^{-1})^3}$$

and the down-sampler $\downarrow 2$ are moved to the left of the subtractor node. Notice that this results in both terms occurring on both branches. From step 3 to step 4, in the upper branch the Noble identity is applied to the numerator of the term $$\left(\frac{1-z^{-16}}{1-z^{-1}}\right)^2$$

and the resulting denominator terms are merged, i.e., $$\frac{1}{(1-z^{-1})^2} \times \frac{1}{(1-z^{-1})^3} = \frac{1}{(1-z^{-1})^5}.$$

In the lower branch, the cascade of the term $$\frac{1}{(1-z^{-1})^3}$$

and the down-sampler $\downarrow 2$ are moved to the left of the 16-entry register bank, thereby reducing the number of registers to 8.

Figure 5:
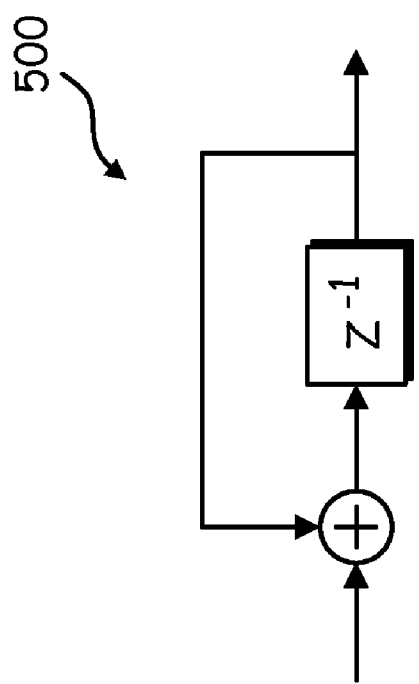
FIG. 5 is a schematic block diagram of a digital integrator.
Figure 4:
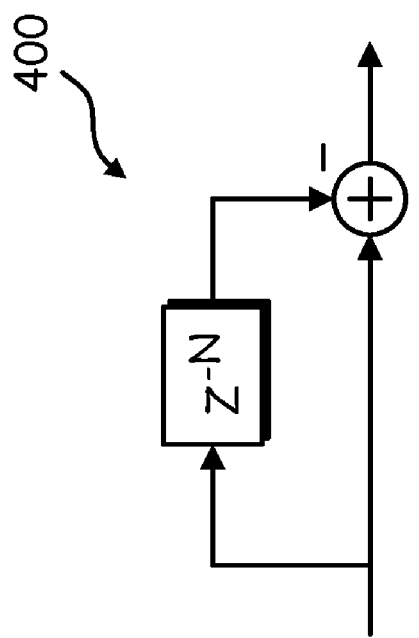
FIG. 4 is a schematic block diagram of a digital differentiator.

To proceed with the simplification, notice that the term $(1-z^{-N})$ can be implemented with N registers and a subtractor, as shown in FIG. 4. This basic structure is referred to as an "N-sample differentiator". Similarly, notice that the term $$\frac{1}{(1-z^{-1})}$$

can be implemented with a single register and an adder, as shown in FIG. 5. This basic structure is referred to as an "integrator". Strictly speaking, the block diagram of FIG. 3 shows the implementation of the term $$\frac{z^{-1}}{(1-z^{-1})},$$

a fact that demands careful consideration due to the branching of the filter. In digital design, this is the preferred way to implement an integrator since the delay in the forward path relaxes the timing requirements when multiple integrators are cascaded. Additional considerations hereof are given in the following.

Figure 6:
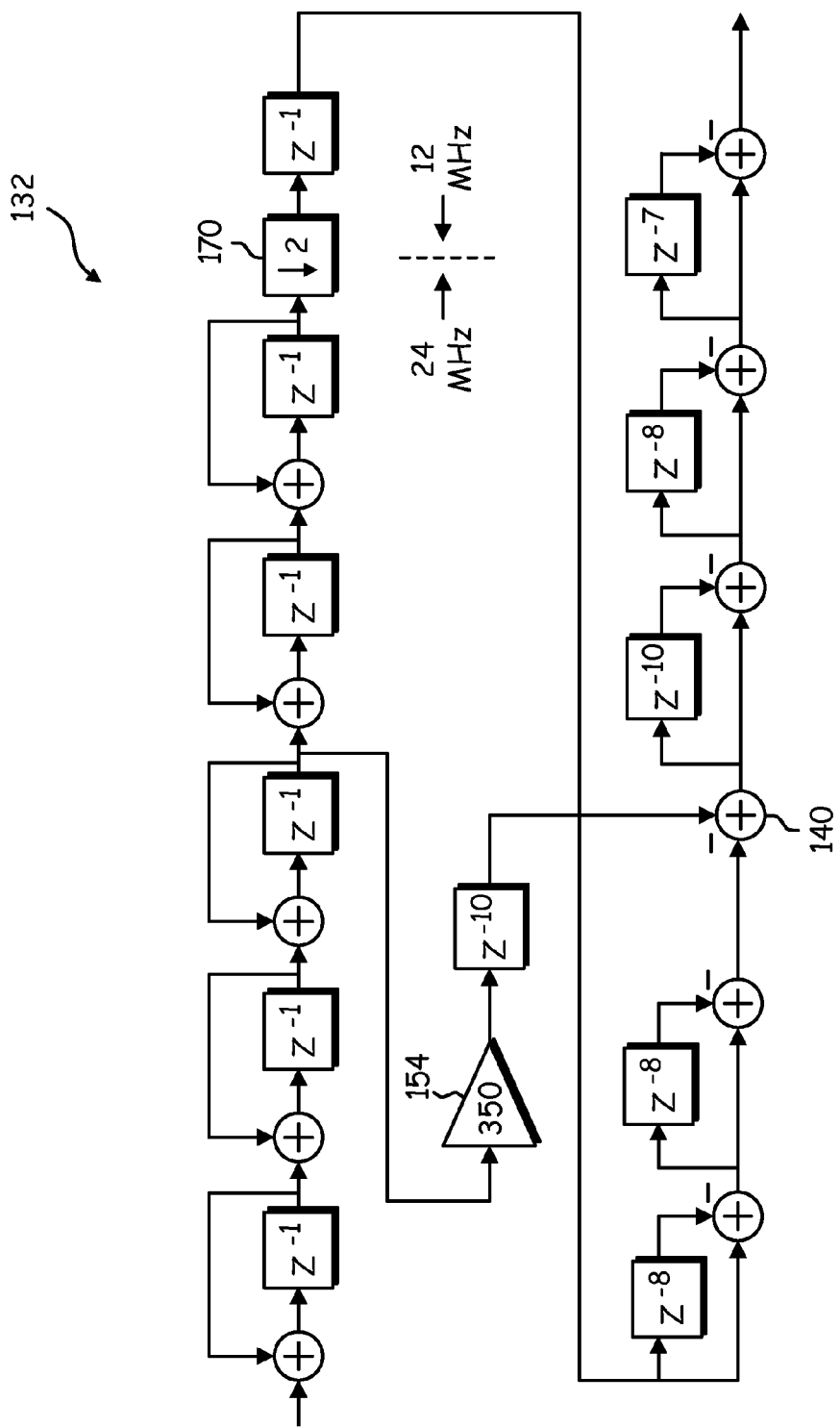
FIG. 6 is a schematic block diagram of an implementation of the channel-select decimation filter of FIG. 3.

FIG. 6 shows the implementation of the simplified form of the channel-select decimation filter shown 132 in FIG. 3, step 4. It consists of five integrators operating at 24 MHz, five differentiators operating at 12 MHz, a subtraction 140, and a number of registers. The implementation shares the processing blocks of the two branches of the filter to a maximum degree as explained in the following. The signal processing path of the upper branch of the filter in FIG. 3, step 4, consists of five integrators, down-sampler 170, register, two 8-sample differentiators, a subtraction 140, a 10-sample differentiator, an 8-sample differentiator, and a 7-sample differentiator. The same processing is achieved in FIG. 6 by starting at the filter input on the left, traversing the five integrators, and following the signal path to the output. The signal processing path of the lower branch of the filter in FIG. 3, step 4, consists of consists of a gain, three integrators, down-sampler, registers, an addition, a 10-sample differentiator, an 8-sample differentiator, and a 7-sample differentiator. The same processing is achieved in FIG. 6 by starting at the filter input on the left, traversing the first three integrators, branching off to the gain block and following the signal path to the output. Notice that due to the "extra" delay in the integrators mentioned above, a few additional registers have been inserted in the paths of the filter in FIG. 6.

Figure 7:
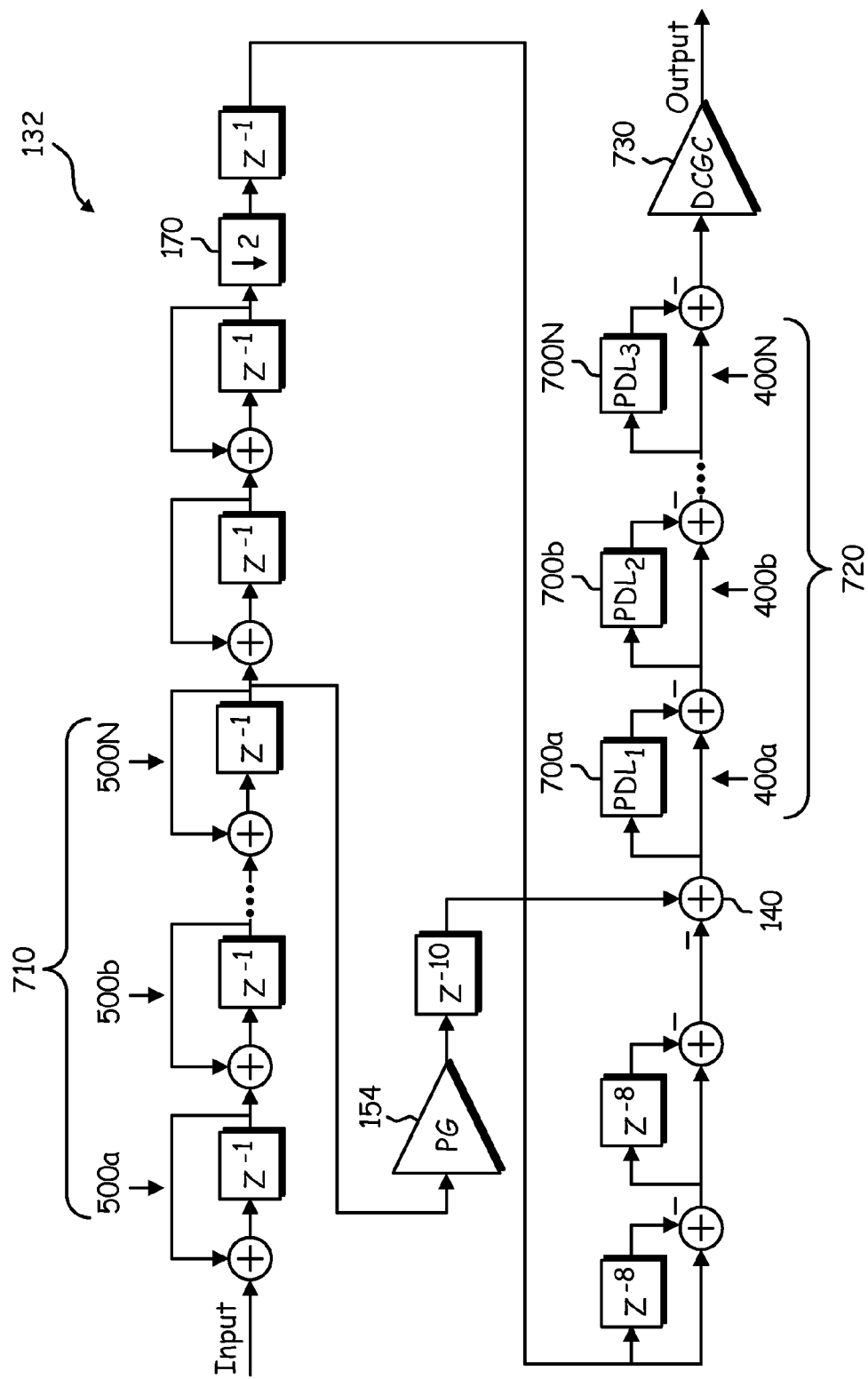
FIG. 7 is a schematic block diagram of a channel-select decimation filter capable of operating in multiple bandwidth modes in accordance with the present invention.

FIG. 7 illustrates another simplified form of the channel-select decimation filter 132 that is capable of operating in multiple bandwidth modes in accordance with the present invention. The programmable decimation filter 132 shown in FIG. 7 includes a plurality of cascaded integrators 500a, 500b . . . 500N forming a first programmable delay module 710, a plurality of cascaded differentiators 400a, 400b . . . 400N forming a second programmable delay module 720 and a programmable gain 154. In addition, each differentiator 400a, 400b . . . 400N is provided with a programmable delay line 700a, 700b . . . 700N. Different filter bandwidths may be achieved by varying the number of cascaded integrators 500a, 500b . . . 500N, the number of cascaded differentiators 400a, 400b . . . 400N, the value of the programmable gain 154 and the value of the programmable delay line 700a, 700b . . . 700N for each differentiator 400a, 400b . . . 400N.

For example, the filter 132 can be provided with a plurality of cascaded integrators 500a, 500b . . . 500N and a plurality cascaded differentiators 400a, 400b . . . 400N, each individually selectable via a switch. Depending on the particular desired bandwidth mode, one or more of the cascaded integrators 500a, 500b . . . 500N and one or more of the cascaded differentiators 400a, 400b . . . 400N can be selected and coupled to the signal lines through their respective switches to receive and filter the input signals. The unselected integrators and differentiators are not coupled to the signal lines, and therefore, the unselected integrators and differentiators are not used to filter the input signals. Although the number of cascaded integrators 500a, 500b . . . 500N and cascaded differentiators 400a, 400b . . . 400N may vary, in general, the total number of cascaded integrators should equal the total number of cascaded differentiators.

For example, the following table illustrates exemplary values for the programmable gain 154 and the programmable delay lines 700a, 700b, 700N when using three integrators and three differentiators to achieve five different filter bandwidth modes:

| BW MODE | BW (kHz) | PG | $PDL_1$ | $PDL_2$ | $PDL_3$ |
|---|---|---|---|---|---|
| 1 | ≈40 | 1.5 | $z^{-7}$ | $z^{-6}$ | $z^{-6}$ |
| 2 | ≈50 | 1.5 | $z^{-6}$ | $z^{-6}$ | $z^{-5}$ |
| 3 | ≈60 | 1.5 | $z^{-5}$ | $z^{-5}$ | $z^{-5}$ |
| 4 | ≈70 | 1.5 | $z^{-5}$ | $z^{-4}$ | $z^{-4}$ |
| 5 | ≈80 | 1.75 | $z^{-4}$ | $z^{-4}$ | $z^{-3}$ |

The DC gain of the filter 132 varies with the bandwidth mode. As a result, a DC gain compensation circuit (DCGC) is shown in FIG. 7 to compensate for variations in the DC gain between bandwidth modes.

Figure 8:
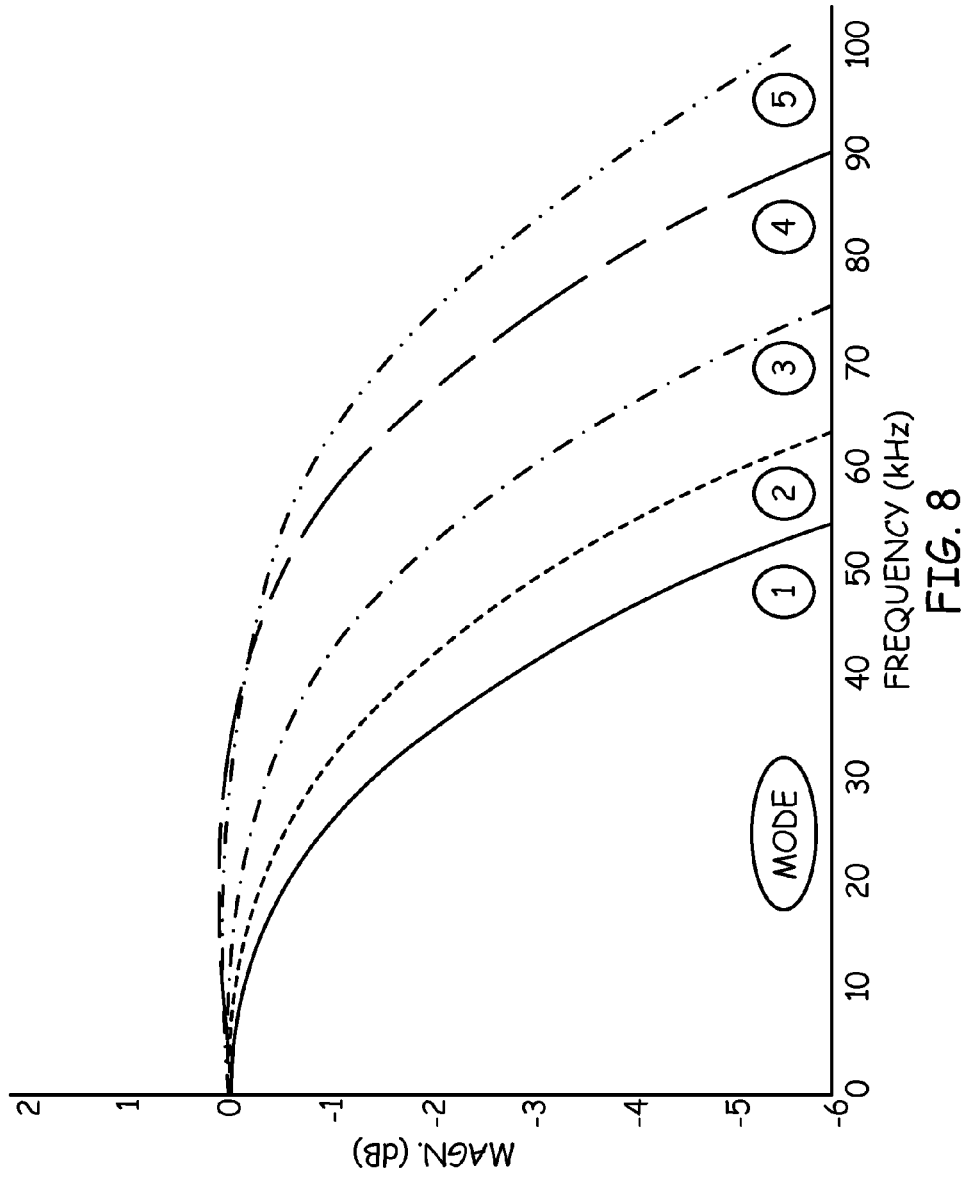
FIG. 8 is a diagram of an exemplary magnitude response of the channel-select decimation filter in accordance with the present invention.
Figure 9:
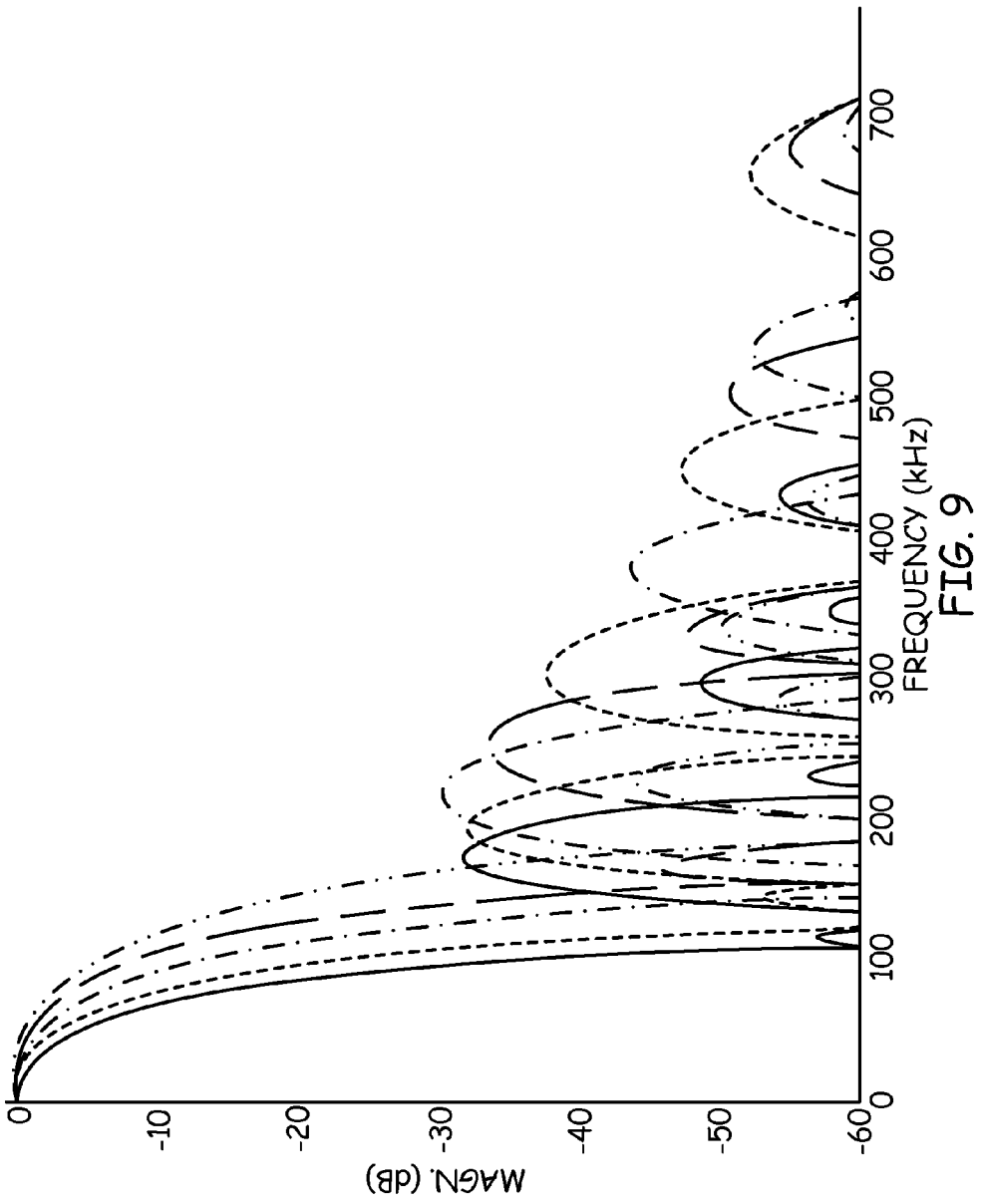
FIG. 9 is a diagram of another exemplary magnitude response of the channel-select decimation filter in accordance with the present invention.

FIG. 8 a diagram of a magnitude response of the channel-select decimation filter 132 for each of the five different bandwidth modes shown in table above in the frequency range of 0-100 kHz. FIG. 9 illustrates an expanded view of the magnitude response of the channel-select decimation filter 132 of FIG. 8 over the frequency range of 0-700 Hz. As can be seen, the magnitude response for each bandwidth mode includes sharp filtering characteristics, as desired.

Figure 10:
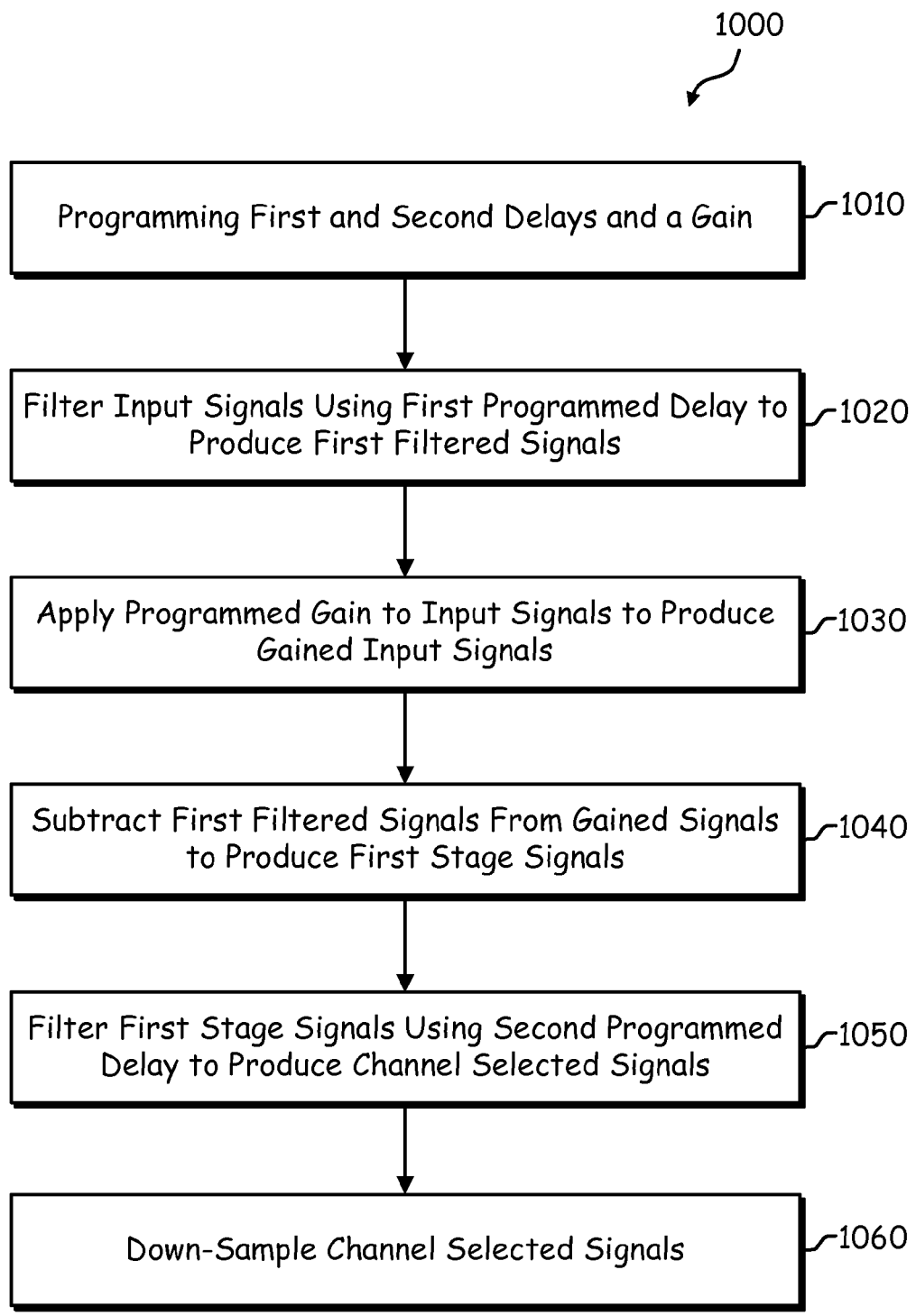
FIG. 10 is a logic diagram of a method for filtering and decimating input signals in a select bandwidth mode in accordance with the present invention.

FIG. 10 is a logic diagram of an exemplary process 1000 for filtering and decimating input signals in a select bandwidth mode using a programmable decimation filter in accordance with the present invention. The processing begins at step 1010 where a first programmable delay, a second programmable delay and a programmable gain are each programmed in the programmable decimation filter for the select bandwidth mode. For example, the first programmable delay line is programmed by selecting a certain number of cascaded integrators from a plurality of available cascaded integrators. The second programmable delay line is programmed by selecting a certain number of cascaded differentiators from a plurality of cascaded differentiators and by programming the individual delay line values for each selected differentiator. Finally, the gain is programmed to a particular gain value depending upon the desired bandwidth mode.

The processing continues at step 1020 where input signals received by the programmable filter are filtered using the first programmable delay, as programmed in step 1010, to produce first low pass filtered signals. At step 1030, the input signals are also provided to the programmable gain, where the programmed gain value is applied to the input signals to produce gained input signals. At step 1040, the first low pass filtered signals are subtracted from the gained input signals to produce first stage signals. Thereafter, at step 1050, the first stage signals are filtered using the second programmable delay, as programmed in step 1010, to produce channel-selected signals. Finally, at step 1060, the channel-selected signals are down-sampled to produce down-sampled channel-selected signals.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled".

The preceding discussion has presented a channel-select decimation filter and applications thereof. As one of ordinary skill in the art will appreciate, other embodiments may be derived from the teachings of the present invention without deviating from the scope of the claims.

What is claimed is:

1. A channel-select decimation filter for operating in multiple bandwidth modes, the channel-select decimation filter comprises:
    a first low pass filter stage including a plurality of cascaded integrators, a select number of the plurality of cascaded integrators selected to form a first programmable delay module, the first low pass filter stage operable to filter input signals to produce first low pass filtered signals;
    a second low pass filter stage including a plurality of cascaded differentiators, a second select number of the plurality of cascaded integrators selected to form a second programmable delay module, the second low pass filter stage operable to filter first stage signal derived from the first low pass filtered signals to produce channel-selected signals; and
    a down-sampling module for decimating the channel-selected signals to produce down-sampled channel-selected signals;
    wherein the first programmable delay module and the second programmable delay module are programmed to implement a select bandwidth mode of the multiple bandwidth modes.

2. The channel-select decimation filter of claim 1, wherein the first programmable delay module delays the filtered signals to produce the first low pass filtered signals.

3. The channel-select decimation filter of claim 2, wherein the second programmable delay module delays the filtered first low pass filtered signals to produce the channel-selected signals.

4. The channel-select decimation filter of claim 1, wherein each of the cascaded differentiators has a programmable delay line programmed to provide the channel-select filter with the bandwidth corresponding to the select bandwidth mode.

5. The channel-select decimation filter of claim 1, further comprising:
    a variable gain stage for applying a programmable gain to the input signals to produce gained input signals; and
    a subtraction module for subtracting the first low pass filtered signals from the gained input signals to produce the first stage signals, the first stage signals being input to the second low pass filter stage.

6. The channel-select decimation filter of claim 5, wherein the variable gain stage comprises:
    a variable gain module for applying the programmable gain to the input signals to adjust a magnitude of the input signals to produce magnitude adjusted input signals; and
    a delay module for delaying the magnitude adjusted input signals to produce the gained input signals.

7. The channel-select decimation filter of claim 6, wherein the programmable gain has a select value of multiple values selected to provide the channel-select filter with a bandwidth corresponding to a select bandwidth mode of the multiple bandwidth modes.

8. The channel-select decimation filter of claim 1, wherein the first select number is equal to the second select number and is chosen to provide the channel-select filter with a bandwidth corresponding to a select bandwidth mode of the multiple bandwidth modes.

9. A radio receiver, comprising:
    a low noise amplifier for amplifying inbound radio frequency (RF) signals to produce amplified inbound RF signals;

a down conversion module for converting the amplified inbound RF signals into low intermediate frequency (IF) signals;

an analog to digital converter for converting the low IF signals into digital low IF signals; and a digital demodulator for converting the digital low IF signals into inbound symbols, wherein the digital demodulator includes:

a baseband conversion module for converting the digital low IF signals into digital baseband signals;

a channel-select decimation filter for filtering the digital baseband signals to produce channel-selected signals in a select bandwidth mode of multiple bandwidth modes, wherein the channel-select decimation filter includes:

a first low pass filter stage including a plurality of cascaded integrators, a select number of the plurality of cascaded integrators selected to form a first programmable delay module, the first low pass filter stage for filtering the digital baseband signals to produce first low pass filtered signals;

a second low pass filter stage including a plurality of cascaded differentiators, a select number of the plurality of cascaded differentiators selected to form a second programmable delay module, the second low pass filter stage for filtering first stage signals derived from the first low pass filtered signals to produce channel-selected signals; and a down-sampling module for decimating the channel-selected signals to produce down-sampled channel-selected signals;

wherein the first programmable delay module, the second programmable delay module and the programmable gain are programmed to implement the select bandwidth mode; and a demodulation module for producing the inbound symbols from the channel-selected signals.

10. The radio receiver of claim 9, wherein the first low pass filter stage comprises:

a plurality of cascaded low pass filters for filtering the input signals to produce low pass filtered signals; and wherein the first programmable delay module delays the filtered signals to produce the first low pass filtered signals.

11. The radio receiver of claim 10, wherein the second low pass filter stage comprises:

a plurality of cascaded low pass filters for filtering the first stage signals to produce filtered first stage signals; and wherein the second programmable delay module delays the filtered first stage signals to produce the channel-selected signals.

12. The radio receiver of claim 11, wherein each of the cascaded differentiators has a programmable delay line programmed to provide the channel-select filter with the bandwidth corresponding to the select bandwidth mode.

13. The radio receiver of claim 9, wherein the channel-select decimation filter further comprises:

a variable gain stage for applying a programmable gain to the digital baseband signals to produce gained input signals; and a subtraction module for subtracting the first low pass filtered signals from the gained input signals to produce the first stage signals, the first stage signals being input to the second low pass filter stage.

14. The radio receiver of claim 13, wherein the programmable gain has a select value of multiple values selected to provide the channel-select decimation filter with a bandwidth corresponding to the select bandwidth mode.

15. The radio receiver of claim 9, wherein the first select number is equal to the second select number and is chosen to provide the channel-select filter with a bandwidth corresponding to a select bandwidth mode of the multiple bandwidth modes.

16. A method for filtering and decimating input signals in a select bandwidth mode of multiple bandwidth modes, comprising the steps of:

programming a first programmable delay and a second programmable delay for the select bandwidth mode, wherein:

the programming the first programmable delay comprises: selecting a first select number of a plurality of cascaded integrators to form the first programmable delay;

the programming the second programmable delay comprises: selecting a second select number of a plurality of cascaded differentiators to form the second programmable delay;

wherein the first number is chosen to provide a filter bandwidth corresponding to the select bandwidth mode;

first filtering the input signals using the first programmable delay to produce first low pass filtered signals;

second filtering first stage signals derived from the first low pass filtered signals using the second programmable delay to produce channel-selected signals; and down-sampling the channel-selected signals to produce down-sampled channel-selected signals.

17. The method of claim 16, wherein the first filtering further comprises:

low pass filtering the input signals to produce filtered signals; and delaying the filtered signals to produce the first low pass filtered signals using the first programmable delay.

18. The method of claim 17, wherein the second filtering further comprises:

low pass filtering the first stage signals to produce filtered first stage signals; and delaying the filtered first stage signals to produce the channel-selected signals using the second programmable delay.

19. The method of claim 18, wherein the programming further comprises programming each of the cascaded differentiators with a programmable delay line to provide the channel-select filter with the bandwidth corresponding to the select bandwidth mode.

20. The method of claim 19, further comprising:

applying a programmable gain to the input signals to produce gained input signals; and subtracting the first low pass filtered signals from the gained input signals to produce first stage signals;

and wherein the programming further comprises:

programming the programmable gain with a select value of multiple values selected to provide a filter bandwidth corresponding to the select bandwidth mode.

* * * * *